United States Patent
Haegele

(10) Patent No.: US 8,134,083 B2
(45) Date of Patent: Mar. 13, 2012

(54) CIRCUIT CARRIER

(75) Inventor: Bernd Haegele, Tittmoning (DE)

(73) Assignee: AB Mikroelektronik Gesselschaft mit beschrankter Haftung, Salzburg (AT)

( * ) Notice: Subject to any disclaimer, the term of this patent is extended or adjusted under 35 U.S.C. 154(b) by 331 days.

(21) Appl. No.: 12/314,086

(22) Filed: Dec. 3, 2008

(65) Prior Publication Data

US 2009/0205858 A1   Aug. 20, 2009

Related U.S. Application Data

(63) Continuation of application No. PCT/AT2007/000254, filed on May 25, 2007.

(30) Foreign Application Priority Data

Jun. 7, 2006  (AT) ................................. A 973/2006

(51) Int. Cl.
*H05K 1/16* (2006.01)

(52) U.S. Cl. ........ 174/260; 174/255; 174/257; 174/263; 174/164; 361/518; 361/533; 361/536; 361/771; 257/687; 257/700; 29/830; 29/841

(58) Field of Classification Search .................. 174/260, 174/255, 257, 263, 164; 361/518, 533, 536, 361/771; 252/500, 518.1; 257/687, 700; 29/830, 841

See application file for complete search history.

(56) References Cited

U.S. PATENT DOCUMENTS

| | | | |
|---|---|---|---|
| 3,202,591 A | 8/1965 | Curran | |
| 3,340,164 A | 9/1967 | Zimmerman | |
| 4,410,598 A | 10/1983 | Kuzel et al. | |
| 4,544,577 A * | 10/1985 | May | 427/555 |
| 4,598,167 A * | 7/1986 | Ushifusa et al. | 174/258 |
| 4,700,276 A * | 10/1987 | Freyman et al. | 361/771 |
| 4,700,473 A * | 10/1987 | Freyman et al. | 29/846 |
| 4,797,992 A * | 1/1989 | Powers et al. | 29/600 |
| 5,029,242 A * | 7/1991 | Sammet | 174/257 |
| 5,672,083 A * | 9/1997 | Curtin et al. | 445/25 |
| 5,740,603 A | 4/1998 | Kim | |
| 5,948,521 A | 9/1999 | Dlugosch et al. | |
| 6,052,273 A * | 4/2000 | Inoue et al. | 361/523 |
| 6,716,554 B2 * | 4/2004 | Tsukamoto et al. | 429/181 |
| 7,569,165 B2 * | 8/2009 | Barker et al. | 252/518.1 |
| 2005/0065241 A1 | 3/2005 | Ishii et al. | |
| 2006/0273287 A1 * | 12/2006 | Young et al. | 252/500 |

FOREIGN PATENT DOCUMENTS

DE        32 01 430        9/1982

(Continued)

OTHER PUBLICATIONS

International Search Report issued Nov. 9, 2007 in parent International (PCT) Application PCT/AT2007/000254.
Russian Office Action issued Jan. 28, 2011 in corresponding Russian Application No. 2008152823/09(069609).
Thornwood; "Selectively Sealing Porosity and Cracks in Anodized Aluminum for Dielectric Protection"; IBM Technical Disclosure Bulletin, International Business Machines Corp.; Sep. 1989; US, vol. 32, No. 4B, p. 158.

(Continued)

*Primary Examiner* — Xiaoliang Chen
(74) *Attorney, Agent, or Firm* — Wenderoth, Lind & Ponack, L.L.P.

(57) ABSTRACT

A circuit carrier having a metal support layer, at least some portions of which are covered by a dielectric layer, the dielectric layer having a plurality of pores, with the pores being sealed by glass at least on the opposite side of the dielectric layer to the support layer.

16 Claims, 2 Drawing Sheets

FOREIGN PATENT DOCUMENTS

| | | |
|---|---|---|
| DE | 195 29 627 | 1/1997 |
| EP | 0 048 992 | 4/1982 |
| EP | 0 115 412 | 8/1984 |
| GB | 990023 | 4/1965 |
| GB | 1 461 031 | 1/1977 |
| JP | 61-571 | 1/1986 |
| RU | 2 254 695 | 6/2005 |
| WO | 97/13274 | 4/1997 |

OTHER PUBLICATIONS

"Selectively Sealing Porosity and Cracks in Anodized Aluminum for Dielectric Protection"; *IBM Technical Disclosure Bulletin*; vol. 32, No. 4B; pp. 158; 1989.

\* cited by examiner

CIRCUIT CARRIER

This application is a continuation application of International application PCT/AT2007/000254, filed May 25, 2007, the entire disclosure of which is incorporated herein by reference.

BACKGROUND OF THE INVENTION

I. Technical Field

The present invention concerns a circuit carrier having a metallic carrier layer on which a dielectric layer is arranged in at least a region-wise manner, wherein the dielectric layer has a plurality of pores.

Circuit carriers of that kind are used primarily in the field of power electronics, in particular in the field of high temperature uses, as in the engine compartment of motor vehicles.

II. Description of the Related Art

The operation of any electrical or electronic circuit is linked to the generation of waste heat which, to avoid adversely affecting operation or seriously damaging the circuit, must be dissipated as quickly as possible. In particular power electronics are distinguished in operation by a very large amount of waste heat. As a further difficulty in high temperature uses there is also the relatively high ambient temperature of over 100° C. (for example about 150° C. in certain regions of the engine compartment of motor vehicles). To provide for dissipation of the waste heat as quickly as possible, the electrical or electronic circuits are mounted on circuit carriers, the metallic carrier material of which can function as a cooling body for the circuit.

The layer of dielectric material which is generally very much thinner than that of metallic material serves in particular to electrically insulate the individual conductor tracks arranged on the layer of dielectric material, from the metallic carrier material. In addition it is possible to select a dielectric material which is distinguished by a very low heat transmission resistance so that the waste heat from electrical or electronic components arranged on the layer of dielectric material can be carried away by way of the metallic carrier element as quickly as possible.

After its manufacture the dielectric layer may have a large number of pores. For various reasons it may be necessary to seal those pores with a sealing material. For example, the presence of pores adversely affects the electrical insulation capability of the layer of dielectric material, which can be problematical in particular in a humid working environment. Due to the penetration of moisture into the pores, electrical short-circuits can occur between the conductor tracks and the metallic carrier material.

Depending on the respective production process involved, the problem of the formation of pores occurs to differing degrees. In particular production processes in which the layer of dielectric material is applied to the metallic carrier material in a thermal spray process suffer from the problem of pore formation.

Processes of that kind are described for example in GB 990 023, GB 1 461 031 and EP 115 412 A2. Although the thermal spraying process in itself is highly suitable for applying the dielectric material to the metallic carrier material, there is nonetheless the problem that the sprayed-on layer of dielectric material has a large number of pores, which can considerably reduce the electrical insulation capability of the layer of dielectric material. The presence of pores is particularly problematical in a damp environment.

By way of example, EP 48 992 A2 describes a process in which after thermal spraying of the layer of dielectric material, a resin is spread on to the layer of dielectric material to seal the pores. DE 195 29 627 C2 also discloses sealing the pores by applying an epoxy resin. In addition, sealing of the pores by a ceramic glaze melting in the temperature range of between 600° C. and 800° C. is also described.

The use of resins is disadvantageous insofar as this involves a relatively complicated and expensive process as the resins have to be hardened in a suitable mold (for example by polymerisation—see EP 48 992 A2). The application of a ceramic glaze as additionally described in DE 195 29 627 C1 is disadvantageous insofar as the ceramic glaze which melts at the specified temperatures and which comes from the porcelain industry is heavily lead-bearing, and therefore can no longer be used in most countries. In addition, it has been found that such a ceramic glaze is frequently itself porous so that the film applied to the layer of dielectric material can itself have holes. In that case the problem of the occurrence of short-circuits is not overcome at all.

SUMMARY OF THE INVENTION

The object of the invention is to provide a circuit carrier which avoids the above-mentioned disadvantages of the state of the art.

That object is attained by a circuit carrier having a metallic carrier layer on which a dielectric layer is arranged in at least region-wise manner, wherein the dielectric layer has a plurality of pores, the pores being sealed with a glass at least on the side of the dielectric layer that is remote from the carrier layer.

The use provided in accordance with the invention of glass as a sealing material has the advantage over the use of resins that the glass does not have to be hardened in a separate working operation.

For example it can be provided that the glass is applied in a thermal spraying process. That is preferably effected simultaneously with thermal spraying of the layer of dielectric material (for brevity: the dielectric layer). In both cases, hardening of the glass takes place automatically by cooling.

It can also be provided that the glass is spread or printed on to the layer of dielectric material (for example in a screen printing process). In that case hardening can be effected in an oven.

In comparison with the application of a ceramic glaze, described in the state of the art, the use of glass has the advantage that it does not have to be lead-bearing and in addition does not have any holes after the application operation itself.

It is particularly advantageous if it is provided that the surface of the side of the dielectric layer, that is remote from the carrier layer, is substantially free from glass.

That can be achieved either by the removal of the glass from the surface of the dielectric layer or, in the case of using a thermal spraying process, by the selection of suitable process parameters.

Conductor tracks can be applied in a known manner on the sealed dielectric layer. The finished circuit carrier can have electrical and/or electronic components. To produce conductor tracks a conductive paste can be applied to the dielectric layer and then introduced. Application of the paste can preferably be effected by screen printing or a jet process.

By way of example a ceramic material, preferably aluminum oxide ($Al_2O_3$) or aluminum nitrite (AlN) can be used for the dielectric layer.

By way of example it can be provided that the glass used comprises dibismuth trioxide, aluminum oxide, silicon dioxide or diboron trioxide or a mixture of two or more of those components. In a possible embodiment it can be provided that the glass used comprises 55% dibismuth trioxide, 21% aluminum oxide, 14% silicon dioxide and 10% diboron trioxide. Suitable glasses can be obtained for example from Ferro Corporation, 1000 Lakeside Avenue, Cleveland, Ohio 44114-7000, USA (www.ferro.com).

The desired sealing of the pores can be achieved with an amount of sealing material (glass) of between about 5% and 30% of the total amount of dielectric material and sealing material (glass).

The metallic carrier layer can consist of for example aluminum or copper.

If plasma spraying is selected as the thermal spraying process, care should be taken to ensure that the sealing material which is mostly in powder form is selected to be of such a grain size and melting temperature that the sealing material can be sprayed on to the metallic carrier material in combustion-free fashion up to the necessary spraying temperature, for example 2100° C.

By way of example it is possible to use $Al_2O_3$ powders of particle sizes of between 5 μm and 60 μm (typically 5.6 μm or 22.5 μm) and with a melting temperature of 2050° C.

In all embodiments it is preferably provided that the layer of metallic carrier material functions at the same time as a mechanically (rigid) carrier for all components of the circuit carrier.

BRIEF DESCRIPTION OF THE DRAWINGS

Further advantages and details of the individual embodiments of the invention will be apparent from the Figures and the related specific description. In the Figures.

DETAILED DESCRIPTION OF THE INVENTION

Figure 1:
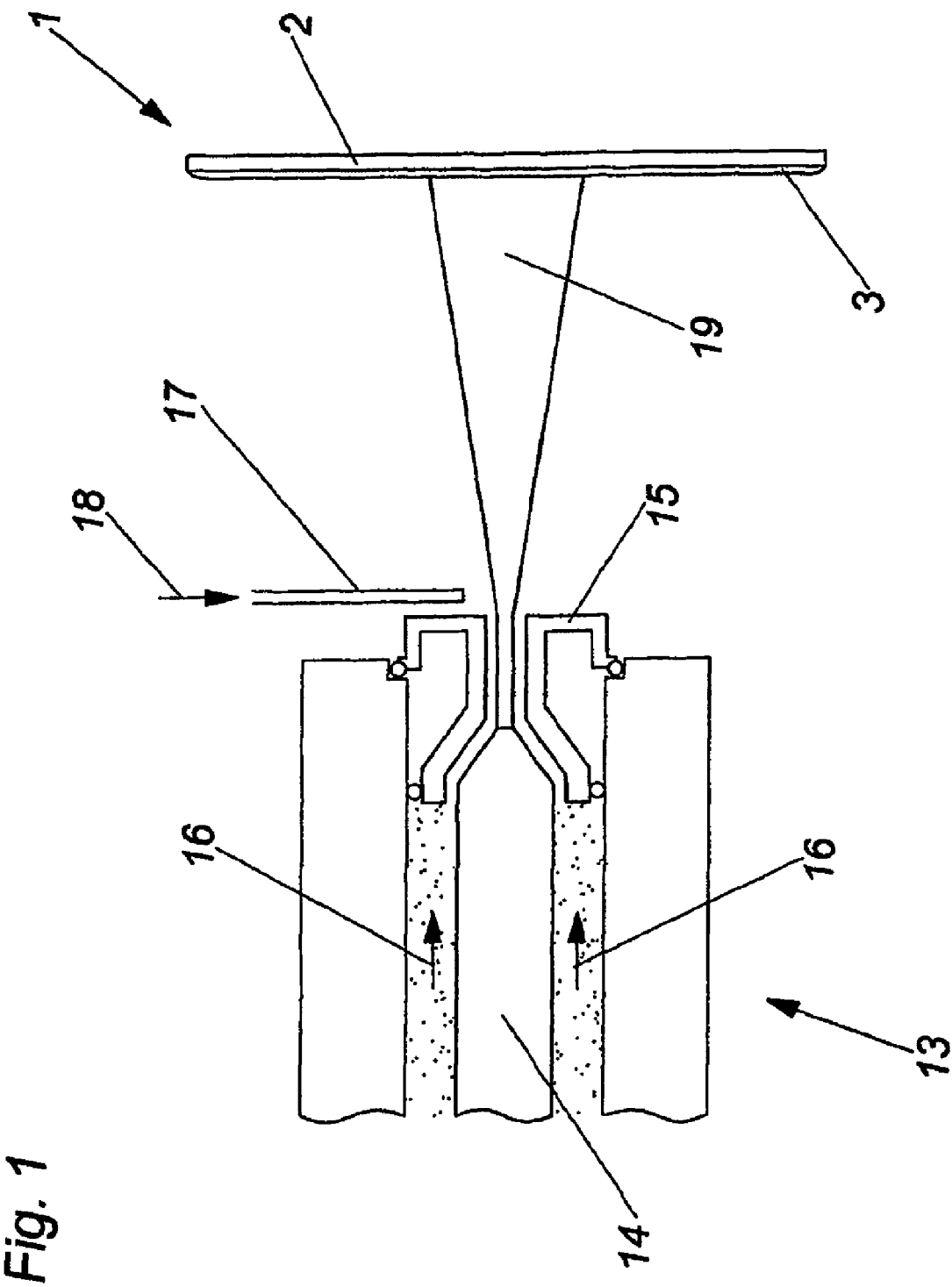
FIG. 1 diagrammatically shows an apparatus for carrying out a process according to the invention.

FIG. 1 shows the thermal spraying of a layer 3 of a dielectric material on to a layer 2 of metallic carrier material of a circuit carrier 1. The Figure diagrammatically shows a plasma gun 13 having a cathode 14 and an anode 15. The arrows 16 indicate the feed of plasma gas. High frequency ignition results in the formation of an arc between the cathode 14 and the cathode 15, resulting in ionisation of the plasma gas. The resulting plasma leaves the burner nozzle at high speeds (between about 300 and 700 m/s) and at temperatures of between about 15,000 and 20,000° C. The material to be applied to the layer 2 (represented by the arrow 18) is introduced by way of an introduction device 17 into the plasma jet where it is melted thereby and accelerated to a high speed. The molten material impinges at high speed on the metallic carrier layer 2 (jet 19) and is deposited there as a layer 3 of dielectric material (for brevity: dielectric layer 3). In a preferred embodiment a mixture of the sealing material (glass 9) and the dielectric material is introduced jointly by way of the introduction device 17 into the plasma jet.

Figures 2A, 2B, 2C:
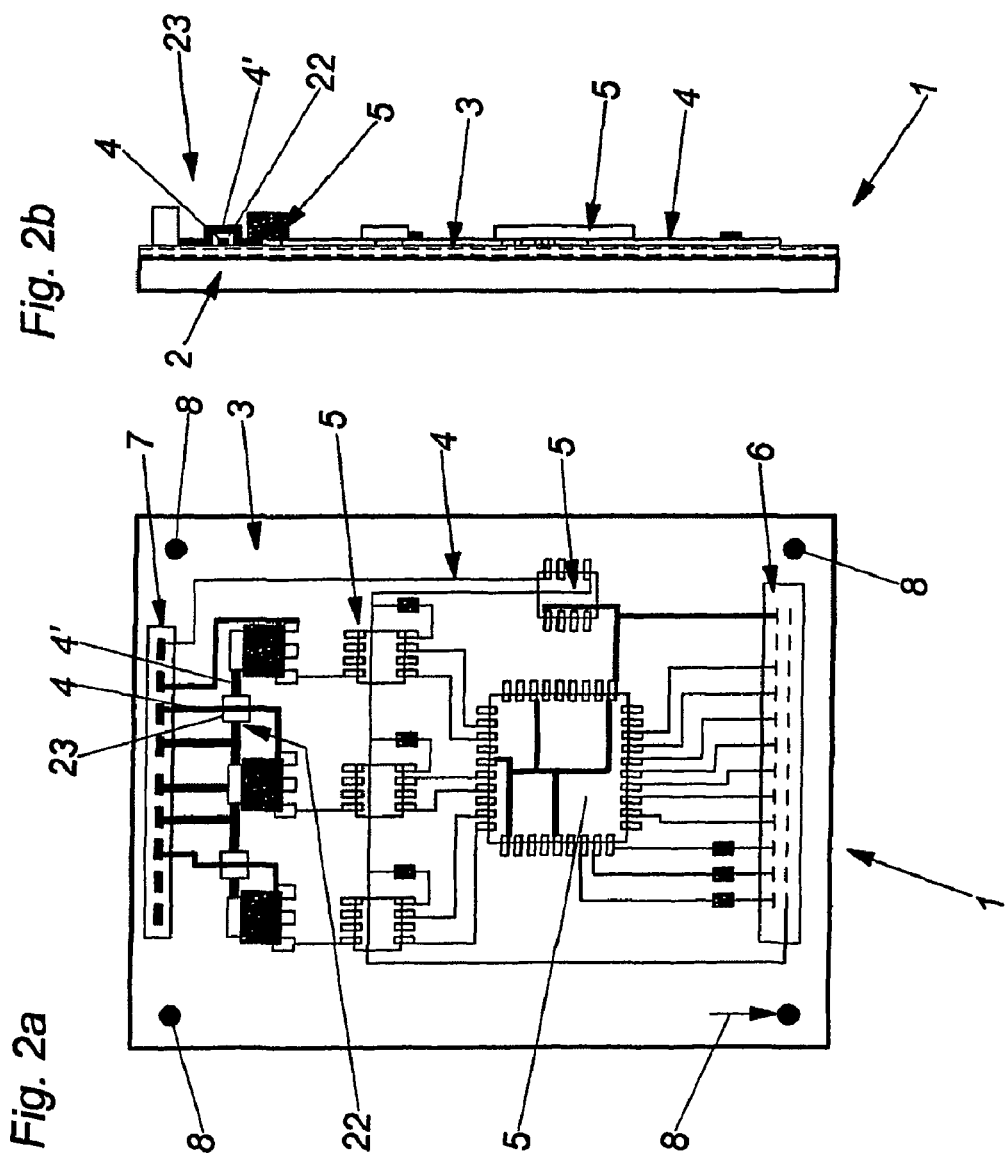
FIGS. 2a, 2b, 2c show a plan view, a side view and a detailed view, respectively, of a circuit carrier produced with the process according to the invention.

FIG. 2a shows a plan view illustrating by way of example a circuit carrier 1, with conductor tracks 4 and electrical and electronic components 5 being mounted on the layer 3 of dielectric material of the circuit carrier 1. In this embodiment the metallic carrier layer 2 comprises aluminum which, prior to the thermal spraying operation, was cleaned and roughened by means of a sand blasting procedure. Arranged at the four corners of the metallic carrier layer 2 are bores 8 by way of which the circuit carrier 1 can be later screwed in place. FIG. 2a further shows a twenty four-pole contact strip 6 and a nine-pole contact strip 7. The illustrated electronic and electrical components 5 involve a microcontroller, regulator, driver circuits, power transistors and resistors.

The conductor tracks 4 were applied by printing after the operation of thermally spraying on the dielectric layer 3 and were then sintered at temperatures of between 400° C. and 530° C. A solder paste layer was then applied by means of screen printing to the printed conductor tracks 4, and then the electrical and electronic components 5 were fitted into the paste layer.

The fitted components 5 and the contact strips 6, 7 were simultaneously soldered on the circuit carrier 1.

To achieve ideal dissipation of the waste heat of the electrical or electronic components 5, all electrical or electronic components 5 were mounted on the circuit carrier 1 (on the dielectric layer 3 thereof) directly, that is to say without an intermediate carrier.

FIG. 2b shows the layer structure of a circuit carrier 1 according to the invention. It will be appreciated that this view is not true to scale. For example the thickness of the metallic carrier layer 2 can be up to 10 mm (typically 1-5 mm) while the dielectric layer 3 is usually of a thickness of between 30 μm and 70 μm.

FIG. 2c shows a detail view of the circuit carrier 1 shown in FIGS. 2a and 2b in the region of the dielectric layer 3. It is possible to see pores 20 which are disposed in the dielectric layer 3 and which are sealed by a glass 9. It is further possible to see that the surface of the dielectric layer 3 outside the region of the pores 20 is substantially free of glass 9.

The invention claimed is:

1. A circuit carrier comprising:
   a metallic carrier layer; and
   a dielectric layer arranged on said metallic carrier layer in at least a region-wise manner,
   wherein said dielectric layer has a plurality of pores in a region, said pores being sealed with a substantially non-conductive glass at least on a side of said dielectric layer that is remote from said metallic carrier layer, and wherein a surface of said dielectric layer outside said region of said pores is substantially free from glass.

2. A circuit carrier as set forth in claim 1 wherein conductor tracks are arranged on said dielectric layer.

3. A circuit carrier as set forth in claim 1 wherein at least one group selected from the groups of electrical and electronic components is mounted on the circuit carrier.

4. A circuit carrier as set forth in claim 1 wherein the material of said dielectric layer is a ceramic material.

5. A circuit carrier as set forth in claim 1 wherein said glass comprises dibismuth trioxide, aluminum oxide, silicon dioxide or diboron trioxide or a mixture of two or more of these components.

6. A circuit carrier as set forth in claim 5 wherein said glass comprises 55% dibismuth trioxide, 21% aluminum oxide, 14% silicon dioxide and 10% diboron trioxide.

7. A circuit carrier as set forth in claim 1 wherein an amount of said glass is between about 5% and 30% of the total amount of dielectric material and glass.

8. A process for the production of a circuit carrier as set forth in claim 1 wherein the layer of dielectric material is applied to the metallic carrier material, and wherein the glass is applied to the circuit carrier during or after the application of the layer of dielectric material.

9. A process as set forth in claim 8 wherein the layer of dielectric material is applied to the metallic carrier layer in a screen printing process.

10. A process as set forth in claim 8 wherein the glass is applied to the layer of dielectric material by spreading or printing.

11. A process as set forth in claim 8 wherein the layer of dielectric material is thermally sprayed on to the metallic carrier layer, jointly with the glass.

12. A process as set forth in claim 8 wherein to produce conductor tracks a conductive paste is applied to the dielectric layer and then fused therein.

13. A process as set forth in claim 12 wherein said conductor tracks are produced by screen printing.

14. A process as set forth in claim 12 wherein said conductor tracks are produced by a jet process.

15. A process as set forth in claim 9 wherein the glass is applied to the layer of dielectric material by spreading or printing.

16. A circuit carrier as set forth in claim 1 wherein, said dielectric layer has a thickness that is less than a thickness of said metallic carrier layer.

* * * * *